United States Patent [19]
Meier

[11] Patent Number: 5,583,428
[45] Date of Patent: Dec. 10, 1996

[54] SOLID OPTICAL CURRENT SENSOR

[75] Inventor: Markus Meier, Aarau, Switzerland

[73] Assignee: ABB Research Ltd., Zurich, Switzerland

[21] Appl. No.: 350,839

[22] Filed: Dec. 7, 1994

[30] Foreign Application Priority Data

Dec. 13, 1993 [DE] Germany ............ 43 42 409.0

[51] Int. Cl.$^6$ ............ G01R 31/00; G02B 5/04
[52] U.S. Cl. ............ 324/96; 324/244.1; 359/281; 359/834
[58] Field of Search ............ 324/96, 117 R, 324/244.1; 359/244, 245, 247, 280, 281, 831, 833, 834, 850, 851, 857

[56] References Cited

U.S. PATENT DOCUMENTS

| | | | |
|---|---|---|---|
| 3,424,516 | 1/1969 | Snyder, III | 359/834 |
| 4,564,754 | 1/1986 | Sato et al. | 324/96 X |
| 4,608,535 | 8/1986 | Tada et al. | 324/244.1 |
| 4,745,357 | 5/1988 | Miller | 324/96 |
| 4,894,608 | 1/1990 | Ulmer, Jr. | 324/96 |

FOREIGN PATENT DOCUMENTS

| | | |
|---|---|---|
| 3339506A1 | 5/1984 | Germany . |
| 59-57170A | 4/1984 | Japan . |
| 62-2180A | 1/1987 | Japan . |
| 62-73179A | 4/1987 | Japan . |
| 510266 | 8/1971 | Switzerland . |

OTHER PUBLICATIONS

"Faraday effect optical current clamp using a bulk-glass sensing element", Y. N. Ning et al., Optics Letters, May 15, 1993, vol. 18, No. 10, pp. 835–837.

"Faseroptische Sensoren", Roland Stierlin, Optoelektronik, Bulletin SEV.VSE 82, (1991) 1.9. Jan., pp. 21–29.

"Miniature Faraday current sensor based on multiple critical angle reflections in a bulk–optical ring", Y. N. Ning et al, Optical Letters, vol. 16, No. 24, Dec. 15, 1991, pp. 1996–1998.

"Accurate Faraday effect current sensor", T. T. Yoshino et al., Advances in Optical Fiber Sensors, pp. 208–217, Oct., 1991.

"Magneto–optical current sensors constructed with ZF glass", S. T. Pai et al., Sensors and Actuators A.35 pp. 107–112, Jun., 1992.

Primary Examiner—Kenneth A. Wieder
Assistant Examiner—Diep Do
Attorney, Agent, or Firm—Burns, Doane, Swecker & Mathis

[57] ABSTRACT

To increase the measuring sensitivity of a simple-to-manufacture, multi-faced solid optical current sensor, at least one of the light-reflecting lateral faces is displaced radially inward with respect to the remaining light-reflecting lateral faces and has a lesser minimum distance from a center of the solid optical current sensor than the other lateral faces. Because of this displacement, the incident light beam does not move through a closed polygonal progression in the course of a single circuit around a recess for a current conductor, whose current intensity is to be measured by means of the Faraday effect. Helically overlapping displacements of the light circuit paths are created, which cause an increase in light sensitivity. The lateral face or another lateral face can also be displaced outwardly instead of inwardly.

11 Claims, 2 Drawing Sheets

SOLID OPTICAL CURRENT SENSOR

FIELD OF THE INVENTION

The invention relates to a solid optical current sensor comprising a multi-faced body having a plurality of light-reflecting lateral faces on its circumference and at least one recess for a current conductor in its interior.

BACKGROUND OF THE INVENTION

In an article by R. Stierlin entitled "Fiber-Optical Sensors" in the *Bulletin SEV/VSE* [Swiss Electro-Technical Assn.] 82, (1991), 1, pp. 21 to 29, a heptagonal block of quartz glass is used, which has in its interior a circular-cylindrical recess for a current conductor whose current is to be detected. At the edge and vertically to a first lateral face, monochromatic light is introduced into the quartz glass block via a polarizer and, after having been reflected three times at three reflecting lateral faces with respectively one 90° vertical deviation in relation to a second lateral face which, together with the first lateral face, forms a right angle, is directed at the edge via a further polarizer to a photodiode for detecting the light intensity. In accordance with the Faraday effect, the direction of polarization of the linearly polarized light during one passage through the quartz block is rotated proportionally to the magnetic field generated by the current and proportionally to the length of the path traveled through the material of the quartz block. The instantaneous current intensity can be calculated from the value of the angle of rotation. The sensitivity of this current sensor is relatively low.

It is known from "Miniature Faraday Current Sensor Based on Multiple Critical Angle Reflections in a Bulk-Optic Ring" by Y. N. Ning et al. in *Optics Letters*, vol. 16, No. 24 (1991), pp. 1996 to 1998, to direct light in several circuits inside a circular cylinder around a current conductor in the center and to evaluate it subsequently. A current sensor which focuses in this way operates close to the angle of total reflection; it is hard to adjust. Applied dielectric coatings pose a problem because of possible contamination.

From "Accurate Faraday Effect Current Sensor" by Toshihiko T. Yoshito in *Advances in Optical Fiber Sensors*, 1991, pp. 208 to 217, it is known to employ pairs of coats of $SiO_2/TiO_2$ and $MgF_2/ZnS$ for coating reflector surfaces in order to reduce the effects of phase shifting during reflection.

OBJECT AND SUMMARY OF THE INVENTION

It is the object of the invention to further develop a solid optical current sensor of the type mentioned above in such a way that, along with a possibility of simple construction, an increase in measuring sensitivity results.

An advantage of the invention resides in the comparatively simple shape and the production advantages resulting therefrom. The interference field sensitivity to adjacent conductors can be reduced.

The invention will be explained below by means of exemplary embodiments.

BRIEF DESCRIPTION OF THE DRAWINGS

The present invention can be further understood with reference to the following description and the appended drawings, wherein like elements are provided with the same reference numerals. In the drawings.

DETAILED DESCRIPTION OF THE PREFERRED EMBODIMENTS

Figure 1:
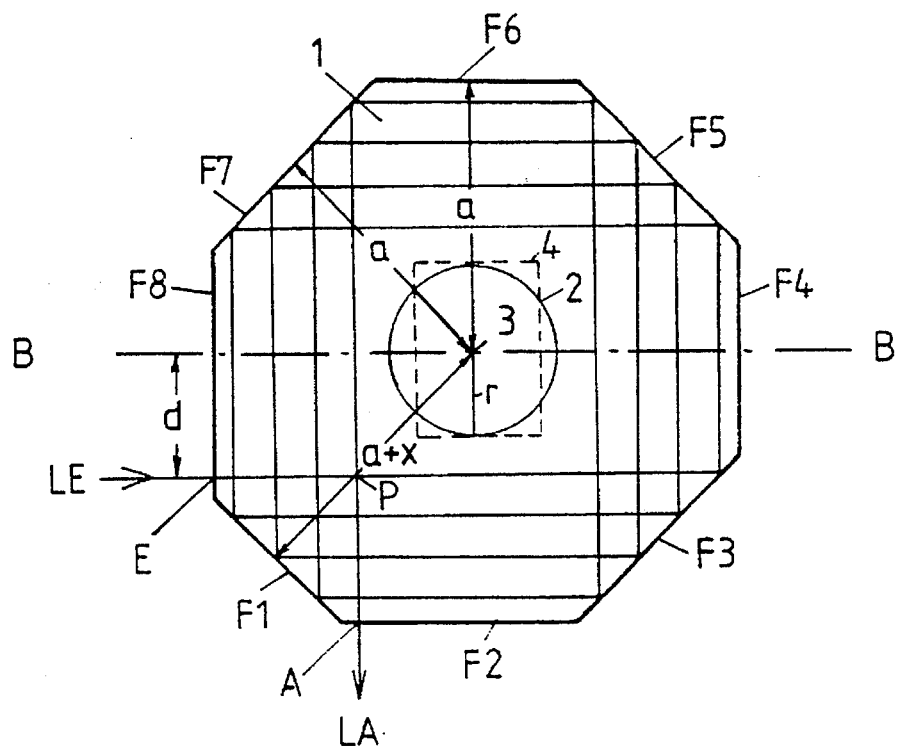
FIG. 1 is a cross section of a solid optical current sensor whose reflective surface is at an increased distance from the center.

FIG. 1 is a representation of a prismatic body (1) of quartz glass which is octagonal in cross section and has seven lateral faces (F2 to F8), which have a pre-selectable equal shortest surface distance (a) from a central point or center (3) of a central, circular-cylindrical recess (2) for a current-carrying conductor, not shown. An eighth lateral face (F1) has a distance from the axis which is greater by a pre-selectable distance (x) than the lateral faces (F2 to FS). At least four lateral faces (F1, F3, F5) and (F7) have been made light-reflecting and are preferably polished and coated with dielectrical coatings in order to prevent an undesirable phase shift in the course of the reflection between vertical and parallel polarization.

At a light entry point (E), incident polarized light (LE) passes vertically and at the edge through the lateral face (F8). After n reflections at the lateral faces (F3, F5) and (F7), as well as n−1 reflections at the lateral face (F1), the light emerges in the form of exiting light (LA) vertically from a light exit point (A) at the edge of the lateral face (F2).

The light entry point (E) has a pre-selectable distance (d) from a cutting plane (B), which is oriented vertically in respect to the lateral faces (F8, F4) and passes through the center (3), which is greater than a radius (r) of the circular-cylindrical recess (2) or the extent of a differently shaped recess (4), for example rectangular in cross section, in the direction of the axis of the incident light (LE). The same is true for the distance, not defined, of the axis of the exiting light (LA) in respect to the center (3).

By means of the axial displacement by the difference distance (x) of the lateral face (F1) in relation to the lateral faces (F2 to FS) it is achieved that the incident light (LE) is guided through the prismatic body (1) in an overlapping helical path instead of a polygonal progression closed on itself. By means of this multiple circulation of the light around the recess (2), an increased sensitivity during the measurement by means of the Faraday effect of a current flowing in the operational state through the current conductor in the interior of the recess (2) is achieved.

However, with this arrangement, a large portion of the light path which is not closed occurs at the angle of rotation $\phi_F$ of the polarized light caused by the Faraday effect in accordance with $$\phi_F = \int V \bullet H \bullet ds.$$

The light entry point (E) and the light exit point (A) are relatively far distant from each other. This creates an undesired interference field sensitivity to adjoining current conductors and a sensitivity in respect to the position of the current conductor in the recess (2). In this case, V is Verdet's constant, H the vector of the magnetic field generated by the current in the current conductor and s a vector of the light path around the recess (2) through the prismatic body (1).

Figure 2:
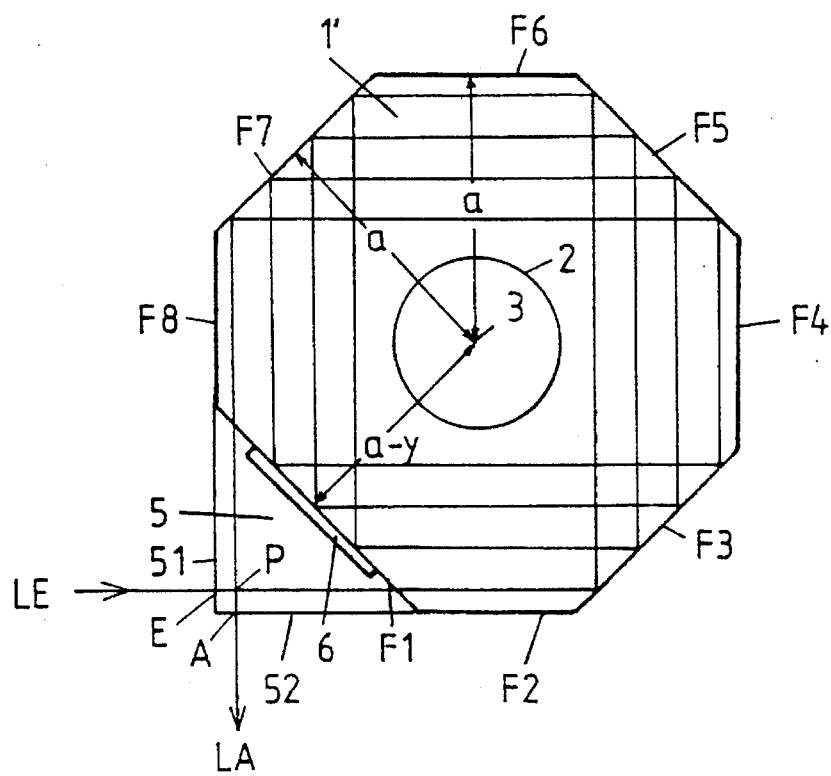
FIG. 2 is a cross section of a solid optical current sensor whose reflective surface is at a reduced distance from the center.

This disadvantage of the interference field sensitivity can be prevented to a large extent with the embodiment in accordance with FIG. 2. In contrast to FIG. 1, the lateral face (F1) of an also octagonal prismatic body (1') there is shortened by a pre-selectable difference distance (y) in comparison with the shortest surface distance (a) of the remaining lateral faces (F2 to F8).

At a light entry point (E), the incident light (LE) enters a three-sided prism (5) vertically through a light entry surface (51) and leaves vertically through a light exit surface (52) of this prism (5) as exiting light (LA). The third lateral face of the three-sided prism (5) rests against the axially-shortened lateral face (F1) of the prismatic body (1'), through the edge of which the incident light (LE) enters the prismatic body (1') from a reflection layer (6), which may consist of several layers. At a edge located opposite in respect to the reflection layer (6), to the left of it in FIG. 2, the multiply-reflected light leaves the prismatic body (1') and enters the three-sided prism (5).

Phase shifts between vertical and parallel polarization, which greatly interfere with the measurement effect, occur at the four reflecting surfaces (F1, F3, F5, F7) during the total reflection between glass/air or with metallic mirror-coating. This disadvantage can be prevented by the application of a suitable dielectric coating. A reflecting layer (6) can be applied to the lateral face (F1) or the adjoining prism surface. A recess for a dielectric reflecting surface (6) is provided in the bearing surface of the prism (5). The same type of reflecting layers (not shown) are applied to the reflecting surfaces (F3, F5, F7). The edge areas for the entry and exit of light cannot have a reflecting layer (6).

The inward or outward displacement of at least one light-reflecting lateral face (F1) should be selected to be large enough so that the intersecting point (P) between the entering light beam (LE) and the exiting light beam (LA) is located as close as possible to the light entry surface (51) as well as the light exit surface (52).

In the exemplary embodiment of FIG. 1, the prismatic body (1) represents the solid optical current sensor, in the exemplary embodiment of FIG. 2 it is the prismatic body (1') in connection with the three-sided prism (5).

It is understood that in place of a recess (2, 4) in the prismatic body (1) it is possible to provide several recesses. In place of quartz it is possible to select another transparent material.

Figure 3:
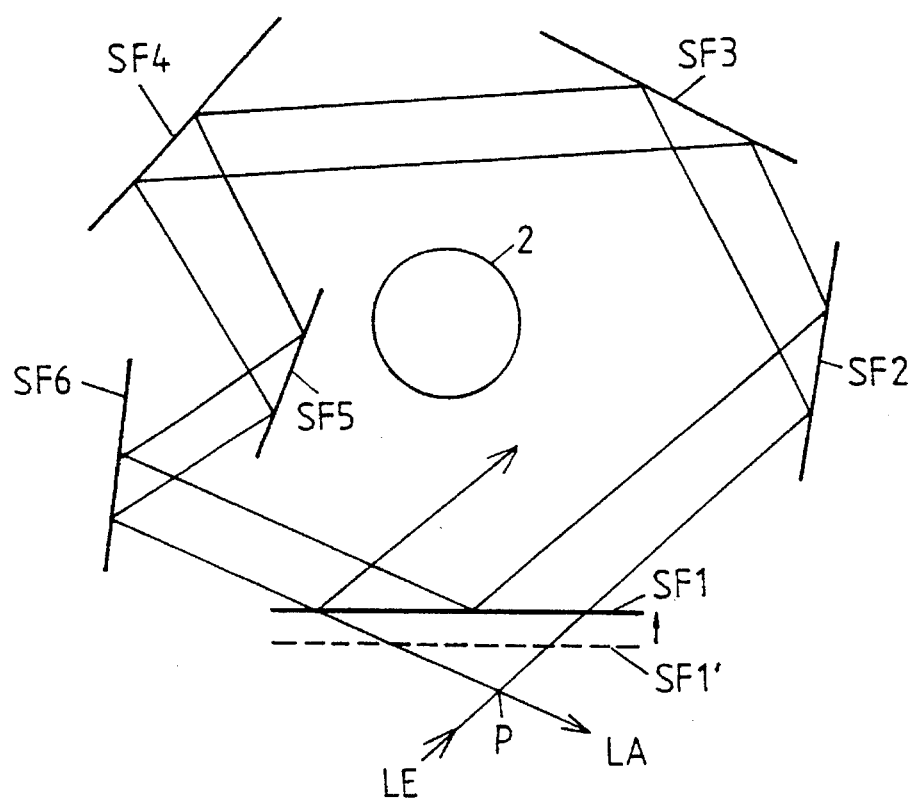
FIG. 3 is a basic representation of reflecting surfaces of a solid optical current sensor with an even number of reflective surfaces.

FIG. 3 shows a solid optical current sensor with an even number of reflecting lateral faces or mirrored surfaces (SF1 to SF6) in a schematic and generalized representation in which, except for the recess (2), the remaining boundary surfaces have been omitted. (SF1') indicates a hypothetical lateral face in whose position the incident light (LE) would move through a closed polygon, following a single circuit around the recess (2). The polygon does not necessarily have to be convex, see the mirrored surface (SF5) located inside the straight line connection between the mirrored surfaces (SF4) and (SF6). The mirrored surface (SF1) is displaced toward the interior in relation to the normal line of the hypothetical lateral face (SF1'), i.e. closer to the recess (2). Because of this the light beam no longer turns back into itself and the desired multiple circulation, together with a helically overlapping displacement, of the light beam is achieved. The incident light (LE) and the exiting light (LA) intersect in an intersecting point (P) outside the mirror surface (SF1).

Figure 4:
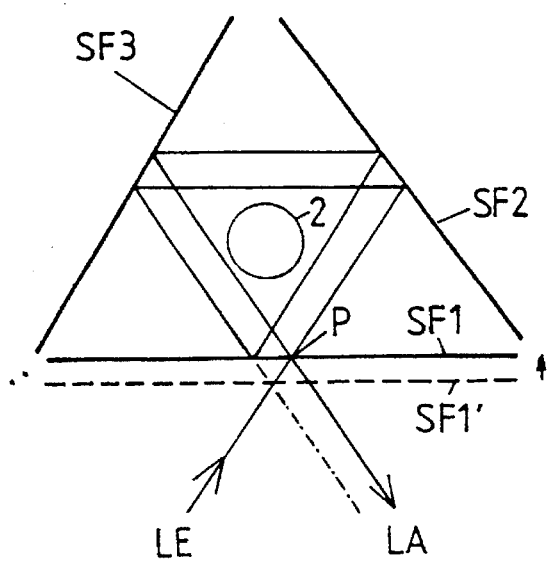
FIG. 4 is a basic representation of reflecting surfaces of a solid optical current sensor with an odd number of reflective surfaces.

Similarly to FIG. 3., FIG. 4 shows a solid optical current sensor with an odd number of reflecting lateral faces or mirrored surfaces (SF1 to SF3) in a schematic and generalized representation. Here, too, the mirrored surface (SF1) is inwardly displaced in relation to the hypothetical lateral face (SF1'), from which a double light circulation results instead of a simple polygon, in which the light beam would turn back into itself after a single circuit. The entering and exiting light beams (LE, LA) intersect in the intersecting point (P) on the mirrored surface (SF1).

In place of an inward displacement of a mirrored surface (SF1 to SF6), an outward displacement vertically in respect to the hypothetical lateral face (SF1') can also take place. It need not necessarily be the coupling surface for the light which is displaced.

With an odd number of mirrored lateral faces, the light beam turns back into itself after two circuits. With an even number of mirrored lateral faces, the light beam never turns back into itself; a helically overlapping displacement of the light beam takes place. The displacement can be greatly increased, limits being set by the finite size of the polygon and the extent of the surface displacement.

If, with an even number of mirrored surfaces, a mirrored surface (SF1, SF3, SF5) with an odd number is displaced toward the interior, the intersecting point (P) is located outside the solid optical current sensor (1, 1'), see FIG. 2. With an outward displacement, the intersecting point (P) is located inside the solid optical current sensor (1, 1'), see FIG. 1. If, however, a mirrored surface (SF2, SF4, SF6) with an even surface number is displaced inward or outward, the intersecting point (P) is located inside or outside of the solid optical current sensor (1, 1'). Solid optical current sensors (1, 1') with an intersecting point (P) located outside show a smaller circuit error (error of the not closed optical path) than those with an intersecting point (P) located inside, so that they are better suited as current sensors.

In place of the coupling surface for the light it is also possible to displace several mirrored surfaces (SF1 to SF6) in the direction of the normal line of their surfaces or in the opposite direction—in place of a hypothetical lateral face arrangement with a closed polygon and a single light circuit. The number of reflecting surfaces is preferably selected to be even, because with this a large number of circuits is possible. The reflecting surfaces need not be flat; they can also be formed so that they are focusing for example.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A solid optical current sensor comprising:
    a multi-faced body having a plurality of light-reflecting lateral faces on its circumference, a light entry point and a light outlet point spaced apart from the light entry point; and
    at least one recess for a current conductor in an interior of said multi-faced body, said plurality of light-reflecting lateral faces being disposed about said at least one recess such that light entering the light entry point is deflected in a light path around the at least one recess to the light outlet point, said multi-faced body including at least one of the following configurations:

(i) at least one of said light-reflecting lateral faces being offset in a direction in which light beams reflected from the at least one of said light-reflecting lateral faces extend inwardly from said multi-faced body, said light path being contained within said multi-faced body after passing at least once around said at least one recess; and (ii) said at least one of said light-reflecting lateral faces being offset in a direction opposite to that in which light beams reflected from said at least one of said light-reflecting lateral faces extend inwardly from said multi-faced body, said light path being contained within said multi-faced body after passing at least once around said at least one recess, such that light entering said light entry point is deflected into at least two paths around the at least one recess to the light output point.

2. A solid optical current sensor in accordance with claim 1, wherein the number of light-reflecting lateral faces is even.

3. A solid optical current sensor in accordance with claim 2, wherein the multi-faced body is a prismatic body.

4. A solid optical current sensor in accordance with claim 3, wherein the prismatic body is axially symmetrical, and includes at least four lateral faces made to be light-reflecting.

5. A solid optical current sensor in accordance with claim 4, further including:

said at least one lateral face having a greater minimum distance from a center of the solid optical current sensor than other lateral faces of the solid optical current sensor; and said light entry point and said light outlet point being provided at lateral faces adjoining the at least one lateral face.

6. A solid optical current sensor in accordance with claim 4, further including:

said at least one lateral face having a lesser minimum distance from a center of the solid optical current sensor than other lateral faces of the solid optical sensor; and said light entry point and said light outlet point being provided at the at least one lateral face.

7. A solid optical current sensor in accordance with claim 6, further comprising:

a three sided prism resting on said at least one of said light reflecting lateral faces, and having a bearing surface; and at least one reflecting layer provided in at least one of an inner region of said bearing face and the at least one of said light reflecting lateral faces, such that light can enter and exit the multi-faced body peripherally of said at least one reflecting layer via said prism.

8. A solid optical current sensor in accordance with claim 7, wherein the at least one recess is provided centrally with respect to remaining ones of said plurality of light-reflecting lateral faces which are not offset.

9. A solid optical current sensor in accordance with claim 8, wherein the light-reflecting lateral faces are polished and include a dielectrical reflecting layer.

10. A solid optical current sensor in accordance with claim 1, wherein the at least one recess is provided centrally with respect to remaining ones of said plurality of light-reflecting lateral faces which are not offset.

11. A solid optical current sensor in accordance with claim 1, wherein the at least one light-reflecting lateral face is polished and includes a dielectrical reflecting layer.

* * * * *